United States Patent
Nakamura (10) Patent No.: US 6,841,476 B1
(45) Date of Patent: Jan. 11, 2005

(54) ELECTROLESS PLATING METHOD

(75) Inventor: Tetsuhiro Nakamura, Tokorozawa (JP)

(73) Assignee: Citizen Watch Co., Ltd., Nishitokyo (JP)

( * ) Notice: Subject to any disclaimer, the term of this patent is extended or adjusted under 35 U.S.C. 154(b) by 4 days.

(21) Appl. No.: 10/088,489

(22) PCT Filed: Sep. 22, 2000

(86) PCT No.: PCT/JP00/06504

§ 371 (c)(1),
(2), (4) Date: Mar. 26, 2002

(87) PCT Pub. No.: WO01/23637

PCT Pub. Date: Apr. 5, 2001

(30) Foreign Application Priority Data

Sep. 27, 1999 (JP) ............................................. 11/272610
Feb. 29, 2000 (JP) ....................................... 2000/052762

(51) Int. Cl.[7] .............................................. H01L 21/44
(52) U.S. Cl. ........................ 438/678; 438/677; 438/686; 438/687; 427/537
(58) Field of Search ................................ 438/678, 674, 438/675; 427/304, 537, 576

(56) References Cited

U.S. PATENT DOCUMENTS 5,462,897 A    10/1995 Baum et al. ................. 437/230
6,403,168 B2 *  6/2002 Meyer et al. ............... 427/537
6,607,981 B1 *  8/2003 Takahashi et al. .......... 438/678

FOREIGN PATENT DOCUMENTS

| EP | 0 887 869 | 12/1998 |
|----|-----------|---------|
| GB | 1103297   | 2/1968  |
| JP | 62-93391  | 4/1987  |
| JP | 7-145485  | 6/1995  |
| JP | 8-3785    | 1/1996  |
| JP | 11-186619 | 7/1999  |

OTHER PUBLICATIONS

Copy of European Patent Office Communication including Search Report for corresponding European Patent Office Application 00961188 dated Jan. 28, 2003.

* cited by examiner

Primary Examiner—David Nelms
Assistant Examiner—Renee R. Berry
(74) Attorney, Agent, or Firm—Westerman, Hattori, Daniels & Adrian, LLP (57) ABSTRACT

A metallic film (2) made of a metal on which an electroless plating film can be deposited is formed on part of the surface of a thermoelectric semiconductor (8) which is an object to be plated, made of a constituent material to which an electroless plating can not be directly applied, and subsequently, the thermoelectric semiconductor (8) is dipped in an electroless plating bath, whereupon a conductive film (3) having a uniform thickness, made up of an electroless plating film, is formed on the entire surface of the thermoelectric semiconductor (8) containing the surface of the metallic film (2).

22 Claims, 10 Drawing Sheets

ELECTROLESS PLATING METHOD

TECHNICAL FIELD

The invention relates to an electroless plating method for applying electroless plating to an object to be plated, made of a constituent material to which an electroless plating can not be directly applied, and in particular, to an electroless plating method suited for forming a conductive film on end faces of metal or semiconductors, to which an electroless plating can not be directly applied.

BACKGROUND TECHNOLOGY

As a thermoelectric device generates a voltage if the opposite ends thereof are maintained at different temperatures, the same is utilized for thermoelectric power generation, and conversely, if electric current is caused to flow therethrough, an exothermic reaction occurs at one end thereof while an endothermic reaction occurs at the other end thereof. Accordingly, the same is also utilized in a cooling apparatus, and so forth, making use of an endothermic phenomenon. Because such a thermoelectric device as described above is simple in construction, and has an advantage over other electric power generators in implementation of miniaturization, and so forth, hopes run high that the same will be applied to portable electronic equipment such as an electronic wrist watch.

The thermoelectric device is made up of a plurality of thermocouples arranged in series, each composed of a p-type semiconductor thermoelectric material and an n-type semiconductor thermoelectric material. The construction of such a common type thermoelectric device as above is described with reference to FIG. 19.

Figure 19:
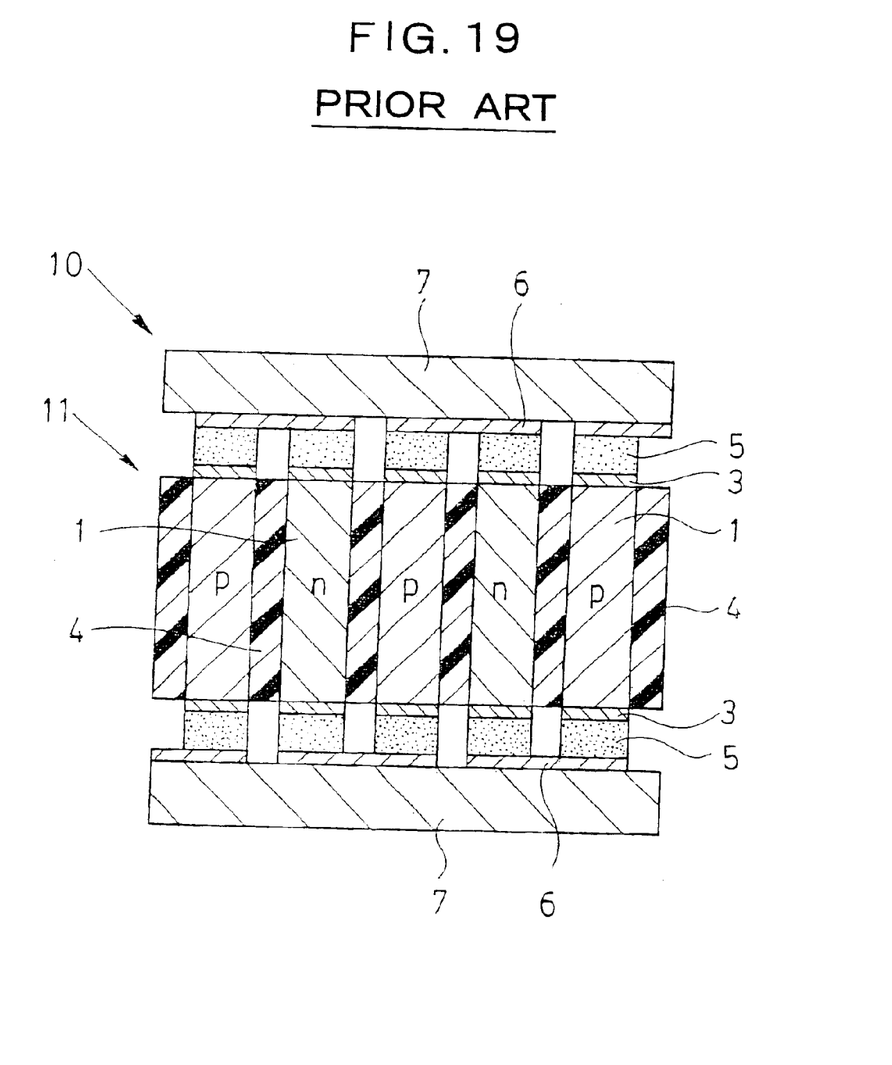
FIG. 19 is a sectional view schematically showing the construction of a common type thermoelectric device.

A thermoelectric device 10 shown in FIG. 19 has a thermoelectric device block 11 wherein p-type thermoelectric semiconductors 1 and n-type thermoelectric semiconductors 1 are alternately disposed with an insulation layer 4 made of epoxy resin, interposed therebetween, respectively. A conductive film 3 provided on an end face of the respective thermoelectric semiconductors 1, on opposite sides thereof, is connected with a wiring electrode 6 made of copper or gold, provided on substrates 7, respectively, through the intermediary of respective connection layers 5, thereby rendering the thermoelectric device block 11 electrically continuous with the substrates 7, and connecting the respective thermoelectric semiconductors 1 with each other in series.

Prior to connecting the thermoelectric device 10 with the substrates 7, the conductive film 3 is formed on the end face of the respective thermoelectric semiconductors 1, on the opposite sides thereof, to be connected with the respective wiring electrodes 6. This is necessary for the following reasons.

The connection layers 5 are provided in order to ensure electrical continuity between the respective thermoelectric semiconductors 1 and the respective wiring electrodes 6, however, if the connection layers 5 are formed of solder, tin contained therein is diffused into the respective thermoelectric semiconductors 1, causing deterioration in performance of the thermoelectric device 10. Accordingly, it is necessary to form the conductive films 3 for elimination of such a risk and to ensure wettability of solder. Further, in the case of forming the connection layers 5 from a conductive adhesive, it is necessary to form the conductive films 3 having a low contact resistance against the conductive adhesive because of a large contact resistance between the respective thermoelectric semiconductors 1 and the conductive adhesive.

In the case of forming a metallic film on a thermoelectric semiconductor, serving as a conductive film, plating is generally adopted. In applying plating, an electroless plating method using a self-catalyzing type electroless plating bath is advantageous in terms of productivity. It is not possible, however, to apply electroless plating to a thermoelectric semiconductor composed of an intermetallic compound of a bismuth-tellurium base or an antimony-tellurium base.

For this reason, in the case of forming a conductive film on the surface of material such as a thermoelectric semiconductor to which it is not possible to apply electroless plating, it has been a normal practice to apply electroplating thereto.

For the formation of the conductive film on the surface of the thermoelectric semiconductor by electroplating, however, electric power needs to be supplied to the thermoelectric semiconductor, which has caused a problem in that the thickness of a plating film formed becomes thinner according as a distance from the point of power supply increases due to a voltage drop caused by a resistance value of the thermoelectric semiconductor. This has resulted in fluctuation in the thickness of the conductive film made up of the plating film, thereby impairing an effect of preventing diffusion of tin contained in solder, and adversely affecting wettability of solder.

In JP11-186619, a method of applying electroless plating by providing a thermoelectric semiconductor with a catalyst, such as platinum, palladium, and so forth, is disclosed as a method of forming a conductive film on a constituent material to which it is not possible to apply electroless plating.

This method, however, is a method whereby electroless plating is implemented by providing a catalyst as seed crystals, and is a method generally adopted for forming a conductive film on plastics. With the method described, there is eliminated the abovementioned problem of uneven thickness of the plating film formed by electroplating, but the following problem has been encountered.

That is, with this method, since adsorption of the catalyst to serve as the seed crystals occurs to parts other than the thermoelectric semiconductor, selectivity on regions where the conductive films are to be formed will be lost upon dipping the thermoelectric semiconductor in an electroless plating bath, causing a problem that the formation of the conductive films occurs to unnecessary regions as well, for example, on the surface of insulators.

Thus, there have so far existed not only a problem that it has not been possible to form the conductive films on the surface of a constituent material to which it is not possible to apply electroless plating, but also a problem that selectivity on the regions where the conductive films are to be formed has been lost even if the conductive films have been formed by electroless plating.

In particular, the thermoelectric device comprises thermoelectric semiconductors which are very small in size, and has sometimes a minuscule structure wherein the thermoelectric semiconductors are disposed at an interval between the adjacent thermoelectric semiconductors, in a range of several to several tens of $\mu$m. The more minuscule the structure of the thermoelectric device, the more difficult it becomes to form the conductive films selectively only on the thermoelectric semiconductors. It is therefore a major problem in the fabrication of the thermoelectric device to selectively form the conductive films by electroless plating.

The invention has been developed to solve those problems, and an object of the invention is to provide an electroless plating method whereby conductive films can be formed even on the surface of a constituent material to which it is not possible to apply electroless plating, and further, to selectively form the conductive films uniform in thickness on end faces of respective thermoelectric semiconductors formed of a constituent material to the surface of which it is not possible to apply electroless plating, thereby enhancing productivity and reliability of a thermoelectric device as fabricated.

DISCLOSURE OF THE INVENTION

An electroless plating method according to the invention comprises the steps of forming a metallic film made of a metal on which an electroless plating film can be deposited on part of the surface of an object to be plated, or causing the metal to be in contact with part of the surface of the object to be plated, made of a constituent material to which an electroless plating can not be applied, and dipping the object to be plated having the metallic film formed thereon or having the metal in contact therewith in an electroless plating bath, and forming an electroless plating film on the surface of the object to be plated, without the metallic film formed thereon and the metal in contact therewith.

Further, the electroless plating method according to the invention may comprise the steps of forming a metallic film made of a metal on which an electroless plating film can be deposited on part of the surface of an object to be plated, or causing the metal to be in contact with part of the surface of the object to be plated, made of a constituent material to which an electroless plating can not be applied, dipping the object to be plated having the metallic film formed thereon or having the metal in contact therewith in an electroless plating bath, and forming an electroless plating film on the entire surface of the object to be plated, containing the metallic film or the metal, removing the metallic film or the metal, and portions of the electroless plating film, covering up the metallic film or the metal, from the object to be plated, and dipping again the object to be plated subjected to the steps described above in the electroless plating bath.

With any of the electroless plating methods described above, the object to be plated may be made of plural kinds of constituent materials or may be a thermoelectric semiconductor.

Further, with any of the electroless plating methods described above, the electroless plating film may be formed so as to have a dual-layer structure comprised of not less than two metallic films.

The electroless plating method according to the invention, applied to the fabrication of a thermoelectric device, may comprise the following respective steps:

(1) the step of forming a metallic film made of a metal on which an electroless plating film can be deposited on one of end faces of a thermoelectric device block formed integrally with a plurality of thermoelectric semiconductors, disposed with an insulation layer interposed therebetween, respectively;

(2) the step of dipping the thermoelectric device block having the metallic film formed thereon in an electroless plating bath, and forming an electroless plating film on the metallic film and the other end face of the respective thermoelectric semiconductors, on the side thereof, opposite from the end face on which the metallic film is formed;

(3) the step of removing the metallic film and a portion of the electroless plating film, covering up the metallic film; and (4) the step of dipping again the thermoelectric device block subjected to the steps described above in the electroless plating bath, and forming an electroless plating film on the end face of the respective thermoelectric semiconductors from which the metallic film is removed.

With the electroless plating methods described above, the following steps (5) to (8) may be substituted for the abovementioned steps (1) to (4):

(5) the step of causing a metal on which an electroless plating film can be deposited to be in contact with a part of at least one of end faces of respective thermoelectric semiconductors of a thermoelectric device block formed integrally with a plurality of thermoelectric semiconductors, disposed with an insulation layer interposed therebetween, respectively;

(6) the step of dipping the thermoelectric device block having the metal in contact therewith in an electroless plating bath, and forming an electroless plating film on the entire surface of the respective thermoelectric semiconductors, except the part thereof, in contact with the metal, (7) the step of separating the metal in contact with the respective thermoelectric semiconductors therefrom; and (8) the step of dipping again the thermoelectric device block subjected to the steps described above in the electroless plating bath, and forming an electroless plating film on the part of the end faces of the respective thermoelectric semiconductors, in contact with the metal.

Further, with the electroless plating methods described above, the following steps (9) and (10) may be substituted for the abovementioned steps (1) to (8):

(9) the step of forming a metallic film made of a metal on which an electroless plating film can be deposited on an end face of respective insulation layers disposed on the side of one of end faces of a thermoelectric device block formed integrally with a plurality of thermoelectric semiconductors, disposed with the respective insulation layers interposed therebetween, such that the metallic film spans the respective insulation layers and a portion of respective end faces of both the thermoelectric semiconductors adjacent to each other across the respective insulation layers alternately disposed; and (10) the step of dipping the thermoelectric device block having the metallic film formed thereon in an electroless plating bath, and forming an electroless plating film on the metallic film and both end faces of the respective thermoelectric semiconductors with the metallic film formed on the portion of the end face thereof.

Still further, with the electroless plating methods described above, the following steps (11) and (12) may be substituted for the abovementioned steps (1) to (8):

(11) the step of forming a metallic film made of a metal on which an electroless plating film can be deposited on either an end face or the other end face of respective insulation layers, alternately, on the sides of both end faces of a thermoelectric device block formed integrally with a plurality of thermoelectric semiconductors, disposed with the respective insulation layers interposed therebetween, such that the metallic film spans the respective insulation layers and a portion of respective end faces of both the thermoelectric semiconductors adjacent to each other across the respective insulation layers; and (12) the step of dipping the thermoelectric device block having the metallic film formed thereon in an electroless plating bath, and forming an electroless plating film on the metallic film and both end faces of the respective thermoelectric semiconductors with the metallic film formed on the portion of the end face and the other end face thereof.

Yet further, with any of the electroless plating methods comprising the abovementioned steps (1) to (12), use may be made of the thermoelectric device block provided with an exposed outer sidewall face of respective thermoelectric semiconductors positioned at opposite ends in the direction along which the respective thermoelectric semiconductors are arranged, and an electroless plating film may be also formed on the exposed outer sidewall faces as well in the step of forming the electroless plating film.

Further, in the case of applying the electroless plating method according to the invention to the fabrication of a thermoelectric device, the electroless plating method preferably comprises the step of rendering the end face of the thermoelectric device block into a rough surface prior to the step of forming the electroless plating film on the thermoelectric device block.

Still further, the electroless plating method preferably comprises the step of cleaning the thermoelectric device block before or after the step of forming the electroless plating film on the thermoelectric device block.

And further, the present invention provides an electroless plating method comprising the steps of preparing an object to be plated, comprised of metal or semiconductors, to which an electroless plating can not be applied, and insulators, and forming a metallic film made of a metal on which an electroless plating film can be deposited on part of the surface of the object to be plated, or causing the metal to be in contact with part of the surface of the object to be plated, and dipping the object to be plated having the metallic film formed thereon or having the metal in contact therewith in an electroless plating bath, and forming an electroless plating film on the entire surface of the object to be plated, except for the insulators.

As the constituent material to which an electroless plating can not be applied, use can be made of a metal or a semiconductor, to which an electroless plating can not be applied.

As the metal on which the electroless plating film can be deposited, use can be made of palladium, platinum or nickel.

An insulating resin is preferably used for the insulators or the insulation layers.

BEST MODE FOR CARRYING OUT THE INVENTION

Figure 1:
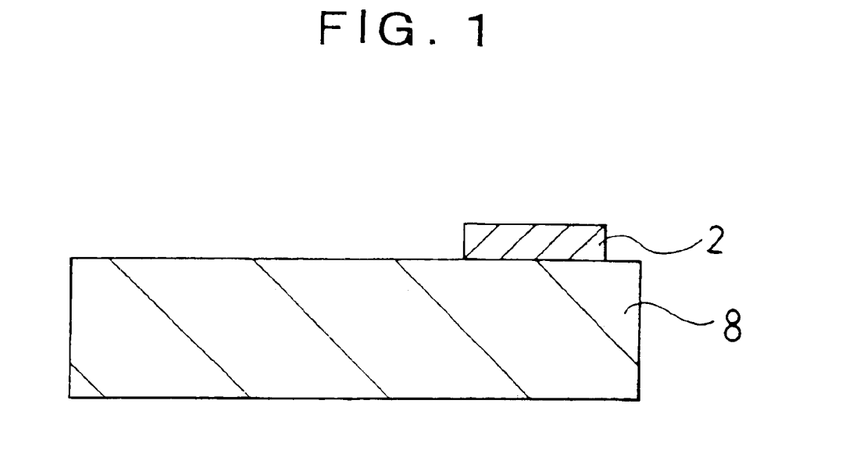
FIG. 1 is a sectional view showing a state wherein a metallic film made of a metal on which an electroless plating film can be deposited is formed on part of the surface of a thermoelectric semiconductor by the invention.
Figure 2:
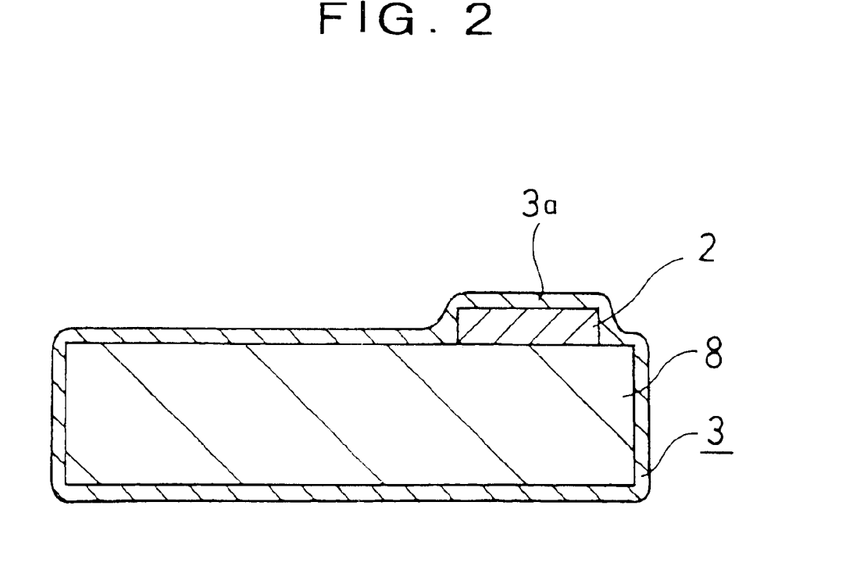
FIG. 2 is a sectional view showing a state wherein a conductive film according to an electroless plating film is formed on the entire surface of the thermoelectric semiconductor and the metallic film.

Preferred embodiments of an electroless plating method according to the invention are described hereinafter with reference to the accompanying drawings. First, the basic embodiment of the electroless plating method according to the invention is described with reference to FIGS. 1 and 2.
Basic Embodiment; FIGS. 1 and 2

FIG. 1 is a sectional view showing a state wherein a metallic film made of a metal on which an electroless plating film can be deposited is formed on part of the surface of a thermoelectric semiconductor which is an example of an object to be plated, made of a constituent material to which an electroless plating can not be directly applied.

A thermoelectric semiconductor 8 is formed in a block shape, and is generally made of an intermetallic compound selected from the group consisting of bismuth-tellurium based compound, antimony-tellurium based compound, bismuth-tellurium-antimony based compound, bismuth-tellurium-selenium based compound, and so forth, but the same may be formed of an intermetallic compound selected from the group consisting of lead-germanium based compound, silicon-germanium compound, and so forth, although not limited particularly to those mentioned above.

In applying the electroless plating method according to the invention, a metallic film 2 made of a metal on which an electroless plating film can be deposited is first formed on part of the surface of the thermoelectric semiconductor 8 by the vacuum deposition method, the sputtering method, or so forth as shown in FIG. 1. The metallic film 2 formed at this point in time may be made of any metal causing deposition of a metal in an electroless plating bath. For example, in the case of executing electroless nickel plating, use is made of a metal such as palladium, platinum, nickel or so froth. Further, the metallic film 2 may be formed by disposing a conductive resin such as a conductive paste, composed of particles of a metal on which an electroless plating film can be deposited and insulating resin, by the printing method, and so forth, besides by the vacuum deposition method, or the sputtering method.

Thereafter, the thermoelectric semiconductor 8 with the metallic film 2 formed thereon is dipped in an electroless plating bath (not shown), whereupon an electroless plating film is first deposited on the surface of the metallic film 2. Because the metallic film 2 is in contact with the thermoelectric semiconductor 8 at this point in time, the potential of the thermoelectric semiconductor 8 relative to the electroless plating bath (a condition for effecting transfer of electrons with the metal in electroless plating bath) undergoes a change, thereby allowing the electroless plating film to be deposited on the thermoelectric semiconductor 8. Accordingly, the electroless plating film deposited from the metallic film 2 spreads out to the thermoelectric semiconductor 8, so that a conductive film 3 according to the electroless plating film having a uniform thickness is formed on the entire surface of the thermoelectric semiconductor 8 and the metallic film 2 as shown in FIG. 2.

In the case of a constituent material to which the electroless plating can not be directly applied being the aforementioned thermoelectric semiconductor, the conductive film 3 is preferably formed of nickel (Ni) highly effective in preventing diffusion of tin, copper, and so forth into the thermoelectric semiconductor although the constituent material thereof is not limited particularly to nickel.

Further, the conductive film 3 may be formed by depositing not less than two kinds of metallic films, one on top of another. For example, the conductive film 3 may be formed by depositing a metallic film made of gold (Au) or copper (Cu) on a metallic film made of nickel so as to have a dual-layer structure. By so doing, it becomes possible to prevent occurrence of cracks otherwise occurring to the metallic film formed of nickel when subjected to stress or thermal stress owing to extensibility of gold (Au) or copper (Cu), thereby enhancing reliability of a thermoelectric device.

With the method described above, it becomes possible to form a conductive film uniform in thickness by electroless plating even on a thermoelectric semiconductor made of a constituent material on which it has been considered that the conductive film can not be deposited directly, so that productivity of a thermoelectric device employing thermoelectric semiconductors can be improved.

An object to be plated which this method is applicable to is not limited to the thermoelectric semiconductor. It becomes possible to form a conductive film made of a metal having a high conductivity by the electroless plating method even on a metal, cadmium, tungsten, zinc, tin, lead, bismuth, antimony and so forth, to which it has been regarded impossible to apply electroless plating.

Further, instead of forming the metallic film made of the metal on which the electroless plating film can be deposited on part of the surface of the object to be plated as described above, the metal on which the electroless plating film can be deposited may be brought into contact with an object to be plated, such as a thermoelectric semiconductor, and so forth, and with such a contact condition maintained by use of a tool such as a clip, the object to be plated may be dipped in an electroless plating bath. With such a method as well, it is possible to obtain the same effect of forming a conductive film uniform in thickness on the entire surface of the object to be plated. In this case, a clip made of a metal on which an electroless plating film can be deposited may be brought into direct contact with the object to be plated. Further, not the whole, but only part of a clip, coming into contact with the object to be plate, may be formed of a metal on which an electroless plating film can be deposited.

Furthermore, after removing the metallic film 2, and a portion 3*a* of the conductive film 3, covering the metallic film 2, shown in FIG. 2, the thermoelectric semiconductor 8 may be dipped again in the electroless plating bath. By so doing, the conductive film 3 can be formed on the entire surface of the thermoelectric semiconductor 8.

Embodiments of the electroless plating method according to the invention for applying electroless plating to a thermoelectric device block will be described in detail hereinafter with reference to FIGS. 3 to 18. In these figures, parts corresponding to those in FIG. 19 are denoted by like reference numerals.

First Embodiment: FIGS. 3 to 8, and FIG. 17

First, a first embodiment of the invention is described with reference to FIGS. 3 to 8, and FIG. 17. This method for applying electroless plating to a thermoelectric device block represents an application of the electroless plating method according to the invention as described hereinbefore.

Figure 3:
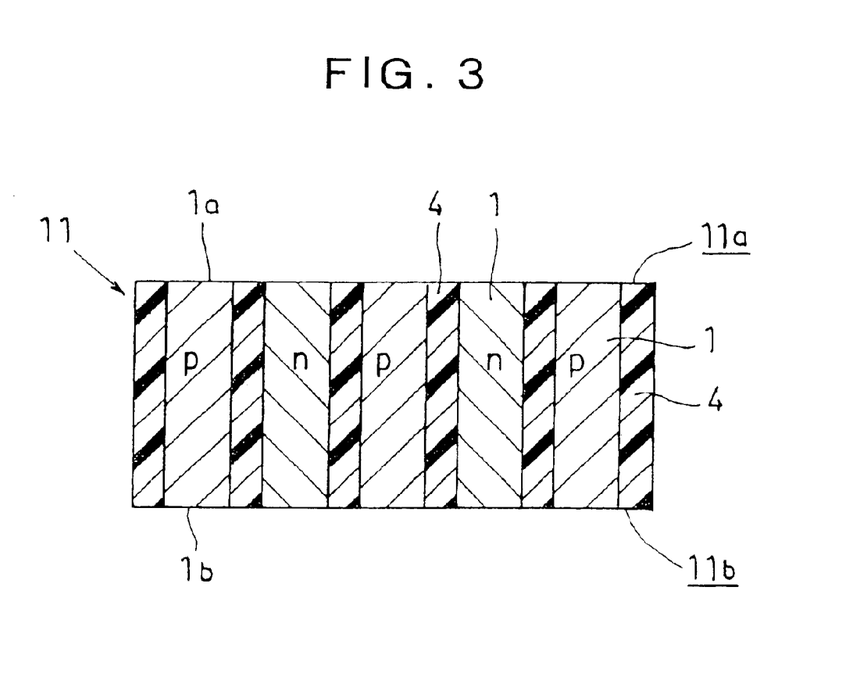
FIG. 3 is a sectional view schematically showing a thermoelectric device block to which electroless plating is applied by the invention.

FIG. 3 is a sectional view of a thermoelectric device block 11 which is an object to be plated. With the thermoelectric device block 11, p-type and n-type thermoelectric semiconductors 1, each in a bar-like shape, are alternately disposed at an interval in a range of about 5 to 80 $\mu$m with an insulation layer 4 made of epoxy resin, interposed therebetween, respectively, and the respective thermoelectric semiconductors 1 adjacent to each other are isolated by the insulation layer 4.

As with the thermoelectric semiconductors 8 described in the foregoing, the thermoelectric semiconductors 1 are made of an intermetallic compound in common use, selected from the group consisting of bismuth-tellurium based compound, antimony-tellurium based compound, bismuth-tellurium-antimony based compound, bismuth-tellurium-selenium based compound, or an intermetallic compound selected from the group consisting of lead-germanium based compound, silicon-germanium based compound, and so forth, although not limited to those mentioned above.

The thermoelectric device block 11 is formed as follows. First, a thermoelectric semiconductor block (not shown) worked into a comb-tooth like shape, with a plurality of grooves provided at a predetermined pitch, is prepared for a p-type and an n-type thermoelectric semiconductors, respectively. Then, these thermoelectric semiconductor blocks are combined with each other such that partition walls of respective grooves of the thermoelectric semiconductor block are fitted into respective grooves of the other thermoelectric semiconductor block, epoxy resin is poured into a gap therebetween, and subsequently, the epoxy resin as poured is cured by applying heat treatment thereto, thereby forming a united block. Thereafter, unnecessary parts of the united block are removed by grinding, whereupon the thermoelectric device block 11 can be obtained.

Figure 4:
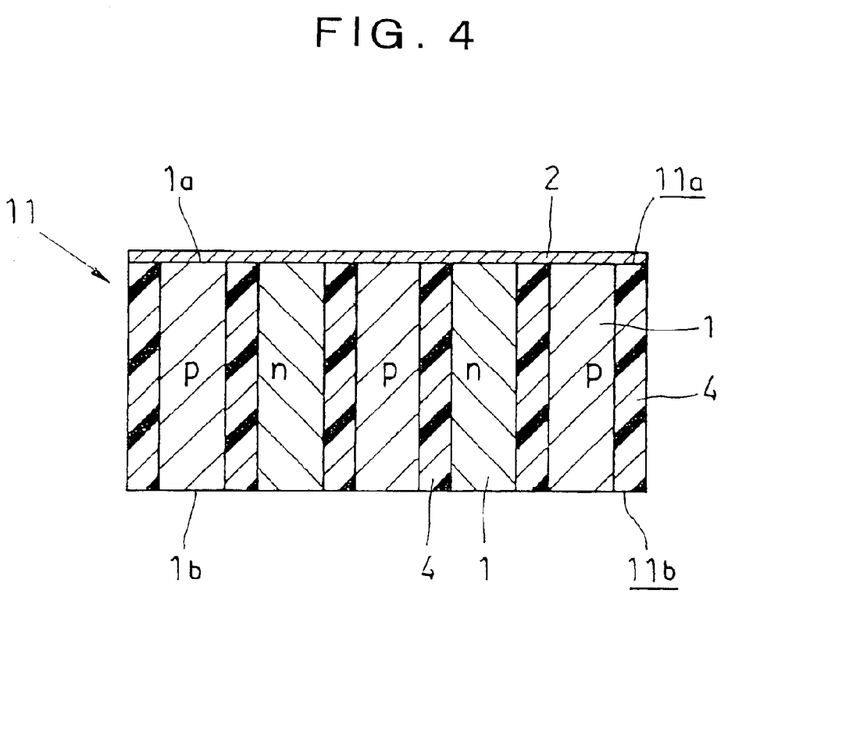
FIGS. 4 to 8 are sectional views sequentially showing respective steps of applying electroless plating to the thermoelectric device block according to a first embodiment of the invention.

Subsequently, by the vacuum deposition method, the sputtering method or so forth, a metallic film 2 is formed on the entire surface of one end face 11*a* of end faces 11*a*, 11*b* of the thermoelectric device block 11, containing end faces 1*a*, 1*b* of the respective thermoelectric semiconductors 1, respectively, as shown in FIG. 4. The metallic film 2 is a film formed of a metal on which an electroless plating film can be deposited, that is, a metal to which deposition reaction of a metal in an electroless plating bath occurs. For example, in the case of electroless nickel plating, the metallic film 2 is formed of a metal selected from the group consisting of palladium, platinum, nickel, and so forth. Further, instead of forming the metallic film 2 by the vacuum deposition method or the sputtering method, the same may be formed by disposing a conductive resin such as a conductive paste, composed of particles of a metal on which an electroless plating film can be deposited and insulating resin, by the printing method, and so forth.

Figure 5:
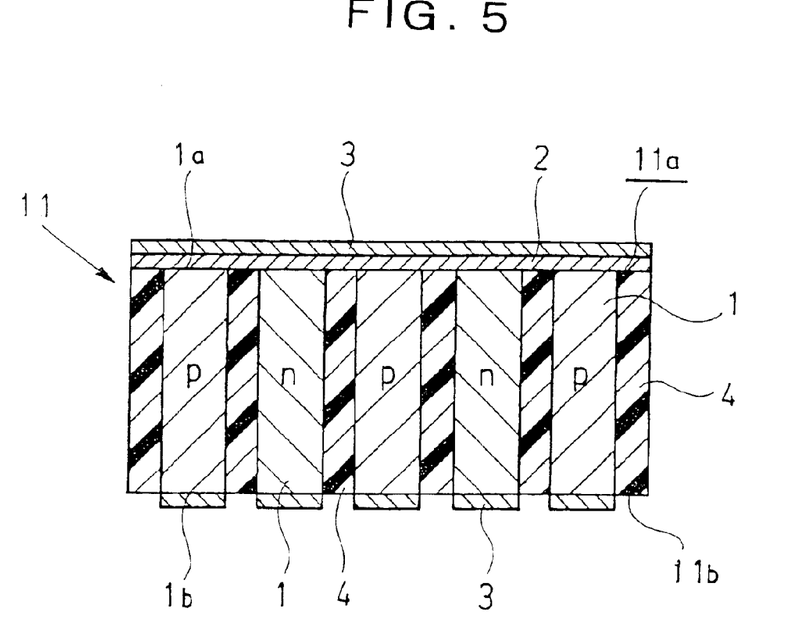

Subsequently, the thermoelectric device block 11 with the metallic film 2 formed thereon is dipped in an electroless plating bath, whereupon deposition reaction of an electroless plating film occurs to the surface of the metallic film 2, as shown in FIG. 5, and simultaneously, the potential of the respective thermoelectric semiconductor 1 relative to the electroless plating bath (a condition for effecting transfer of electrons with the metal in electroless plating bath) undergoes a change, so that deposition reaction of the electroless plating film occurs to the end face 1b as well, on the side of the respective thermoelectric semiconductor 1, where the metallic film 2 is not formed. Thus, a conductive film 3 which is the electroless plating film can be formed directly only on the end face 1b of the respective thermoelectric semiconductors 1.

Figure 6:
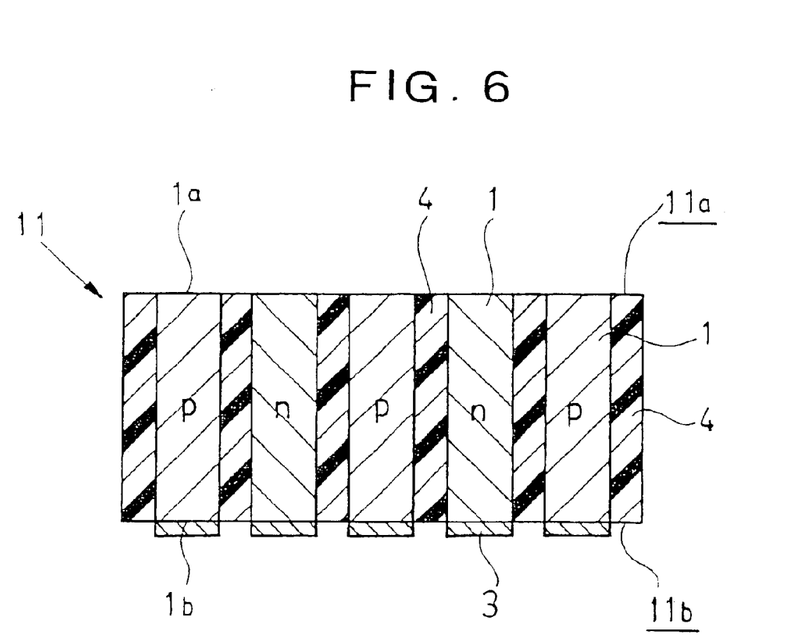
Figure 7:
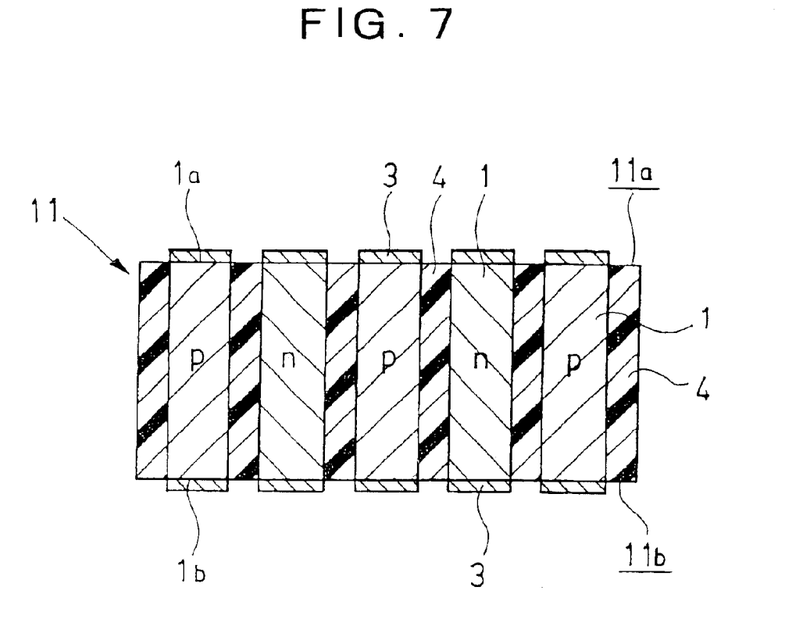

Then, the metallic film 2 and a portion of the conductive film 3, formed on top of the metallic film 2 so as to cover up the same, is removed by etching, as shown in FIG. 6, and thereafter, the thermoelectric device block 11 is dipped again in the electroless plating bath, whereupon a conductive film 3 can be formed selectively only on the end face 1a of the respective thermoelectric semiconductors 1, exposed by removing the metallic film 2 by means of etching, as shown in FIG. 7. With such a method as described above, since the conductive film 3 will not be formed on unnecessary parts such as the insulation layers 4, electrical insulation between the respective thermoelectric semiconductors 1 can be ensured, so that a highly reliable thermoelectric device provided with the conductive film 3 formed only on both the end faces 1a, 1b of the respective thermoelectric semiconductors 1 can be obtained.

Figure 17:
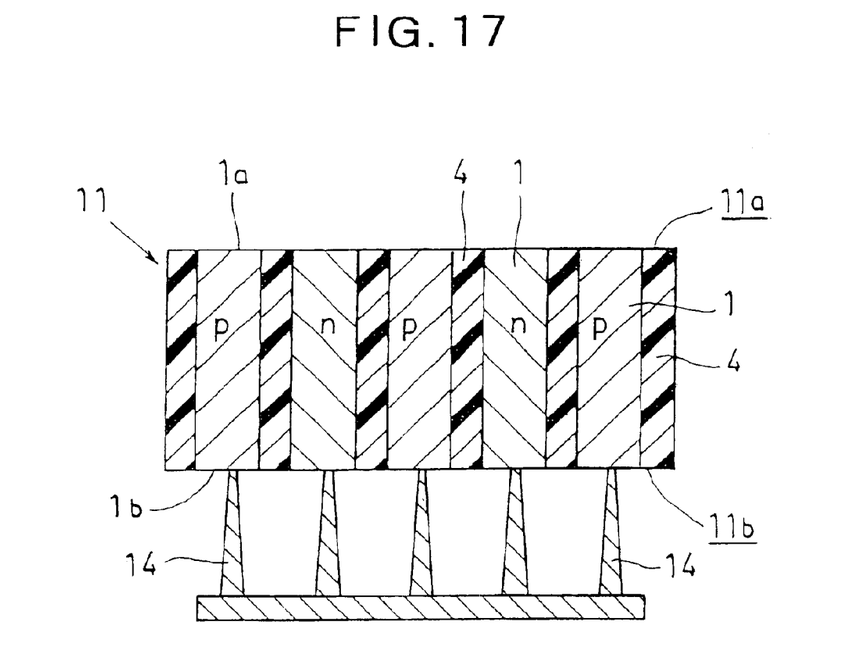
FIG. 17 is a sectional view showing a state wherein probes are caused to be in contact with the thermoelectric device block in applying electroless plating to the thermoelectric device block according to the first embodiment of the invention.

Further, instead of forming the conductive films 3 on the thermoelectric device block 11 as described in the foregoing, the following process may be adopted. First, a probe 14 made of a metal on which an electroless plating film can be deposited, in the shape of a needle as shown in FIG. 17, is caused to be in contact with a part of the end face 1b of the respective thermoelectric semiconductors 1, or a plate (not shown) made of a metal on which an electroless plating film can be deposited, formed in a shape corresponding to the end face 11a (11b) of the thermoelectric device block 11, is caused to be in contact with the end face 1b of the respective thermoelectric semiconductors 1. Thereafter, the thermoelectric device block 11 with the probes 14 in contact therewith is dipped in an electroless plating bath, thereby causing an electroless plating film to be deposited on the entire surface of the respective thermoelectric semiconductors 1, except for a part thereof, in contact with the probe 14. Subsequently, after separating the probes 14 from the respective thermoelectric semiconductors 1, the thermoelectric device block 11 is dipped again in the electroless plating bath, thereby causing an electroless plating film to be deposited on the part of the surface of the respective thermoelectric semiconductors 1, in contact with the probe 14. In this way, it is also possible to form the conductive film 3 only on both the end faces 1a, 1b of the respective thermoelectric semiconductors 1.

At the time when the previously described etching is performed, a photoresist (not shown) is applied to the entire surface of the thermoelectric device block 11, on the side of the end face 11b thereof, shown in FIG. 5. The reason for this is because the conductive film 3 already formed selectively on the end face 1b, on one side of the respective thermoelectric semiconductors 1, needs to be protected by the photoresist while the metallic film 2 and the conductive film 3, formed on the side of the end face 11a of the thermoelectric device block 11, need to be removed with reliability. In this connection, there is available a method of removing the metallic film 2 and the conductive film 3 that are unnecessary by grinding besides the etching.

Nickel is preferably used for the conductive films 3 formed by electroless plating in that nickel is highly effective in preventing diffusion of tin, copper and so forth into the respective thermoelectric semiconductors 1, however, a metal for use in the conductive films 3 is not limited particularly to nickel. Further, the conductive films 3 may be formed by depositing not less than two kinds of metallic films, one on top of another. For example, the conductive films 3 may be formed by depositing a metallic film made of gold (Au) or copper (Cu) on a metallic film made of nickel so as to have a dual-layer structure. By so doing, it becomes possible to prevent occurrence of cracks otherwise occurring to the metallic film formed of nickel when subjected to stress or thermal stress owing to extensibility of gold (Au) or copper (Cu), thereby enhancing reliability of a thermoelectric device.

Figure 8:
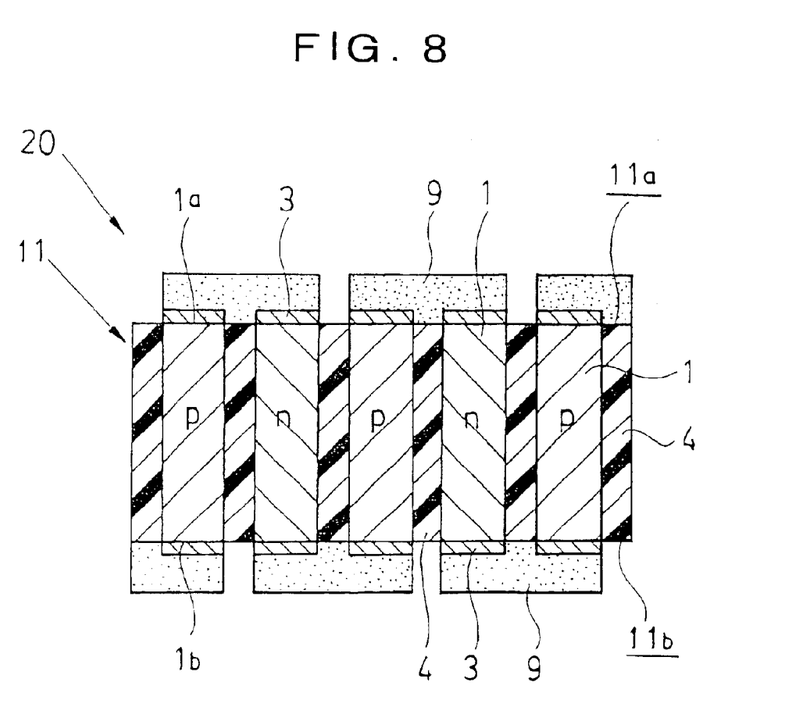

Subsequently, as shown in FIG. 8, connection layers 9 made of a connecting material such as a conductive adhesive or a solder paste are formed by the printing method on the thermoelectric device block 11 provided with the conductive film 3 formed on the end faces 1a, 1b, respectively, on opposite sides of the respective thermoelectric semiconductors 1, shown in FIG. 7. The p-type thermoelectric semiconductors 1 and the n-type thermoelectric semiconductors 1 are alternately connected with each other, respectively, via the respective connection layers 9, and upon applying heat treatment thereto, the respective thermoelectric semiconductors 1 are electrically connected in series, thereby completing a thermoelectric device 20.

For obtaining the thermoelectric device 20 by connecting the respective thermoelectric semiconductors 1 in series, the method shown in FIG. 19 may be adopted. That is, the substrates 7, each provided with the wiring electrode 6 made of copper or gold, formed thereon, are prepared, and by connecting the wiring electrodes 6 with the conductive films 3, respectively, through the intermediary of the respective connection layers 5 formed of solder, a conductive adhesive, an anisotropic conductive adhesive, or so forth, the respective thermoelectric semiconductors 1 may be connected with each other in series.

Second Embodiment: FIG. 3 and FIGS. 9 to 11

Subsequently, a second embodiment of a method for applying electroless plating according to the invention to a thermoelectric device block is described hereinafter with reference to FIG. 3 and FIGS. 9 to 11.

With this embodiment, use is made of the thermoelectric device block 11 shown in FIG. 3 as with the case of the first embodiment, and for other parts such as metallic films, conductive films, an electroless plating bath, and so froth, use is also made of the same constituent materials as those used for the corresponding parts in the first embodiment.

Figure 9:
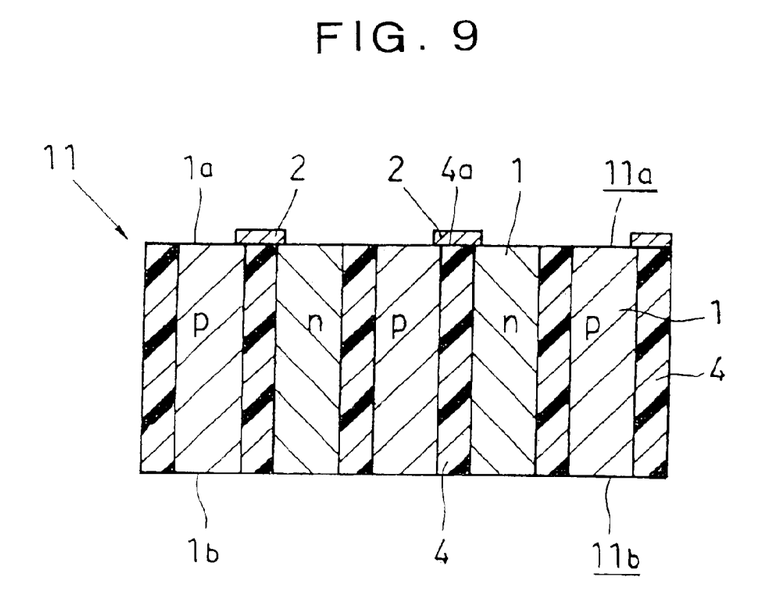
FIGS. 9 to 11 are sectional views sequentially showing respective steps of applying electroless plating to the thermoelectric device block according to a second embodiment of the invention.

First, metallic films 2 on which an electroless plating film can be deposited are formed on an end face 11a of the thermoelectric device block 11 shown in FIG. 3, on one side thereof, by the vacuum deposition method, the sputtering method or so forth. As shown in FIG. 9, the respective metallic film 2 are formed with the use of a metal mask, and so forth, selectively only on a portion of an end face 1a of respective thermoelectric semiconductors 1, on one side thereof, necessary for connecting adjacent p-type and n-type thermoelectric semiconductors 1 together with an insulation layer 4 interposed therebetween. More specifically, each of the metallic films 2 is formed on an end face 4a of the respective insulation layers 4 alternately disposed, and on a portion of the end face 1a of the respective thermoelectric semiconductors 1, on both sides of the end face 4a, so as to span both the thermoelectric semiconductors 1 adjacent to each other across the insulation layer 4 on the end face 11a of the thermoelectric device block 11, such that the insulation layer 4 with the metallic film 2 formed thereon and the insulation layer 4 without the metallic film 2 formed thereon are disposed in an alternating sequence on the end face 11a.

Figure 10:
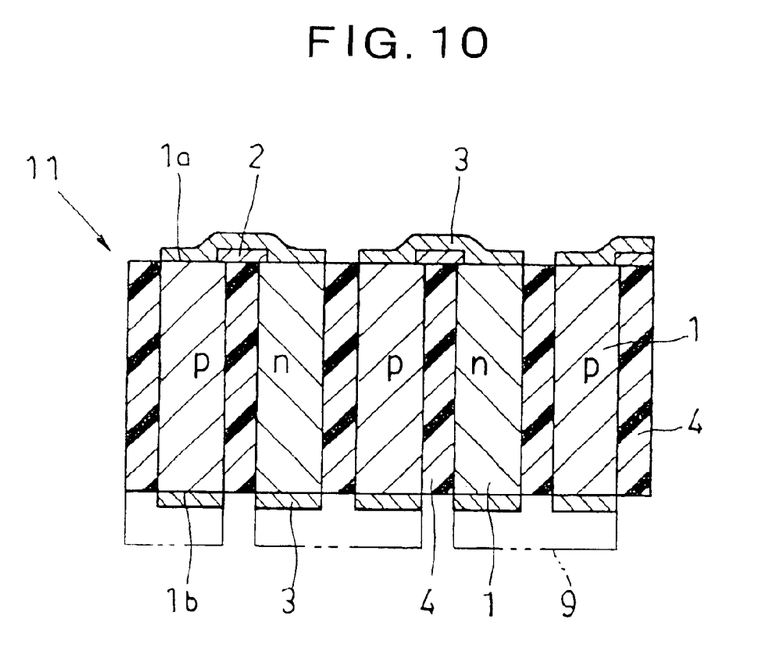

Subsequently, the thermoelectric device block 11 provided with the metallic films 2 formed as described above is dipped in an electroless plating bath, whereupon deposition reaction of an electroless plating film occurs to the surface of the respective metallic films 2, and simultaneously, deposition reaction of an electroless plating film also occurs to the end face 1a of the respective thermoelectric semiconductors 1 with the metallic film 2 formed on (in contact with) a portion thereof, and to an end face 1b, opposite from the end face 1a, as shown in FIG. 10. Thus, a conductive film 3 can be formed only on the end face 1a of the respective thermoelectric semiconductors 1, containing the metallic film 2, and on the end face 1b, opposite from the end face 1a.

Thereafter, as shown by the phantom lines in FIG. 10, a connection layer made of a connecting material such as a conductive adhesive or a solder paste is formed by the printing method on the end face 1b of the respective thermoelectric semiconductors 1, with the conductive film 3 selectively formed thereon, thereby alternately connecting the respective p-type thermoelectric semiconductors 1 with the respective n-type thermoelectric semiconductors 1. Upon applying heat treatment thereto, there is obtained a thermoelectric device wherein the respective thermoelectric semiconductors 1 are electrically connected together in series.

Figure 11:
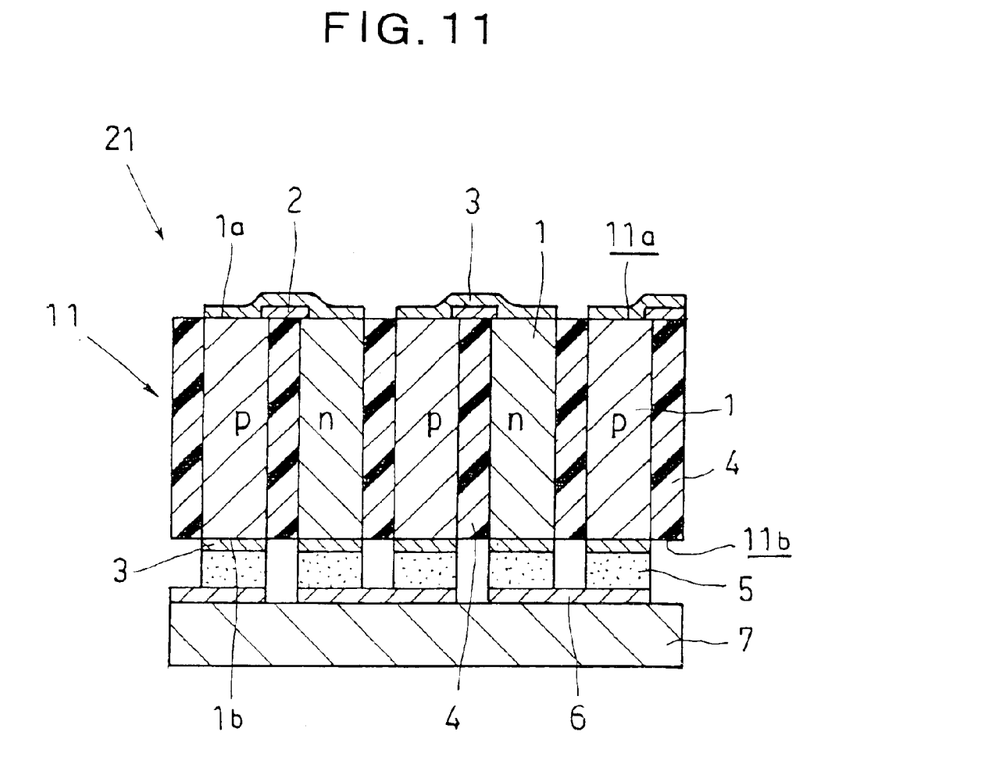

For obtaining the thermoelectric device by connecting the respective thermoelectric semiconductors 1 in series, a substrate 7 with a wiring electrode 6 made of copper or gold, formed thereon, may be used, and by electrically connecting the respective conductive films 3 on the end face 11a side of the thermoelectric device block 11 with the wiring electrode 6 on the substrate 7 through the intermediary of respective connection layers 5 formed of solder, a conductive adhesive, an anisotropic conductive adhesive, or so forth, as shown in FIG. 11, the respective thermoelectric semiconductors 1 may be connected with each other in series, thereby completing a thermoelectric device 21.

In contrast with the first embodiment as previously described, according to the second embodiment, a processing step of removing the metallic film 2 formed on the end face 11a, on one side of the thermoelectric device block 11, is not required, thereby enabling a process up to the completion of the thermoelectric device to be shortened. Accordingly, productivity in fabrication of the thermoelectric device can be improved.

Figure 12:
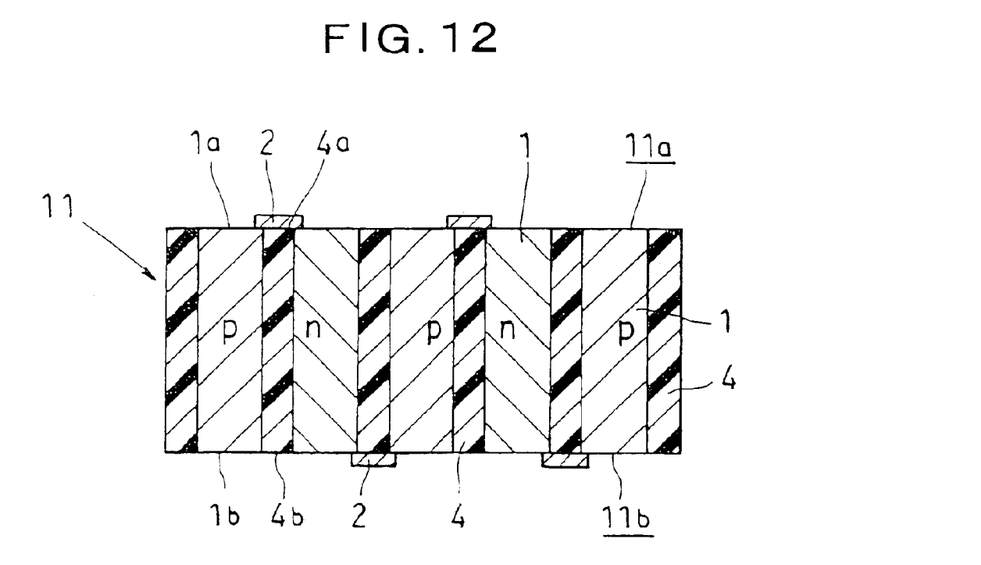
FIGS. 12 and 13 are sectional views sequentially showing respective steps of applying electroless plating to the thermoelectric device block according to a third embodiment of the invention.
Figure 13:
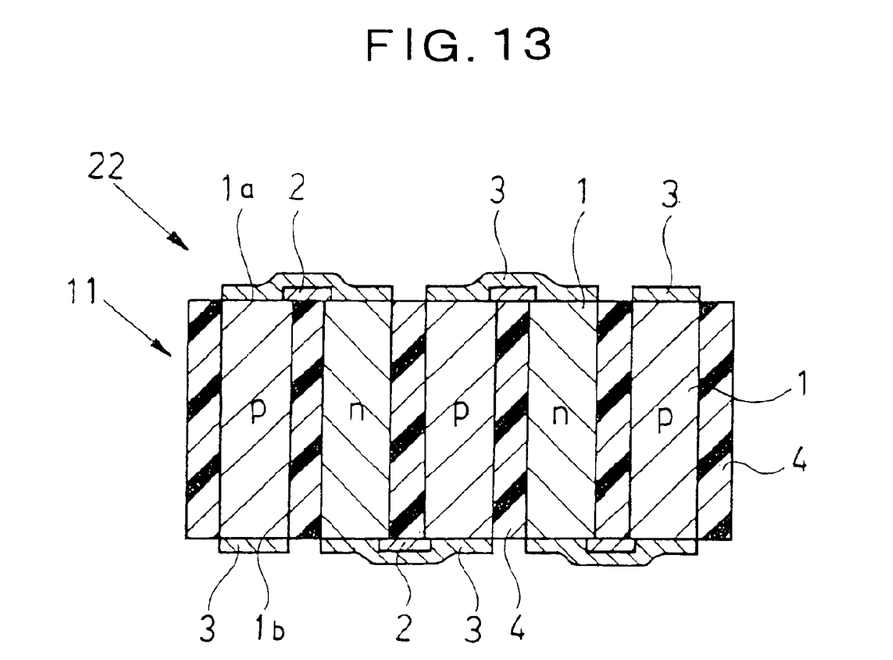

Third Embodiment: FIG. 3 and FIGS. 12 and 13

Subsequently, a third embodiment of a method for applying electroless plating according to the invention to a thermoelectric device block is described hereinafter with reference to FIG. 3 and FIGS. 12 and 13.

With this embodiment, use is made of the thermoelectric device block 11 shown in FIG. 3 as with the case of the first embodiment, and for other parts such as metallic films, conductive films, an electroless plating bath, and so froth, use is also made of the same constituent materials as those used for the corresponding parts in the first embodiment.

First, metallic films 2 on which an electroless plating film can be deposited are formed on end faces 11a, 11b of the thermoelectric device block 11 shown in FIG. 3, on opposite sides thereof, by the vacuum deposition method, the sputtering method or so forth, as shown in FIG. 12. With the use of a metal mask, and so forth, each of the metallic films 2 is formed selectively only on end face 4a, and end face 4b of respective insulation layers 4, in an alternate and staggered sequence, that is, on those where the metallic film 2 is required for connecting respective p-type thermoelectric semiconductors 1 and respective n-type thermoelectric semiconductors 1, disposed on opposite sides of the respective insulation layers 4, with each other, thereby connecting the respective thermoelectric semiconductors 1 in series. More specifically, each of the metallic films 2 is formed so as to span a part of the end faces 1a or the end faces 1b of the adjacent thermoelectric semiconductors 1 with the respective insulation layers 4 interposed therebetween, and also, on the end face 4a and the other end face 4b of the respective insulation layers 4, alternately.

Subsequently, the thermoelectric device block 11 provided with the metallic films 2 is dipped in an electroless plating bath, whereupon deposition reaction of an electroless plating film occurs to the surface of the respective metallic films 2, as shown in FIG. 13, and simultaneously, deposition reaction of an electroless plating film occurs to the end face 1a or 1b of the thermoelectric semiconductors 1 without the metallic film 2 opposite from the end face 1a or 1b with the metallic film 2 formed on (in contact with) part thereof. Thus, a conductive film 3 can be formed only on the end face 1a and 1b of the respective thermoelectric semiconductors 1, and the respective metallic films 2

Because the respective thermoelectric semiconductors 1 of the thermoelectric device block 11 are connected in series via the respective conductive films 3, a thermoelectric device 22 wherein the respective thermoelectric semiconductors 1 are connected in series can be obtained without taking processing steps of alternately connecting the adjacent thermoelectric semiconductors 1 by forming the connection layers and using the substrates as with the case of the first and second embodiments. Accordingly, in comparison with the first and second embodiments, a process up to the completion of the thermoelectric device can be shortened, thereby improving productivity in fabrication of the thermoelectric device.

Fourth Embodiment: FIGS. 14 to 16 and FIG. 18

Subsequently, a fourth embodiment of a method for applying electroless plating according to the invention to a thermoelectric device block is described hereinafter with reference to FIGS. 14 to 16 and FIG. 18.

Figure 14:
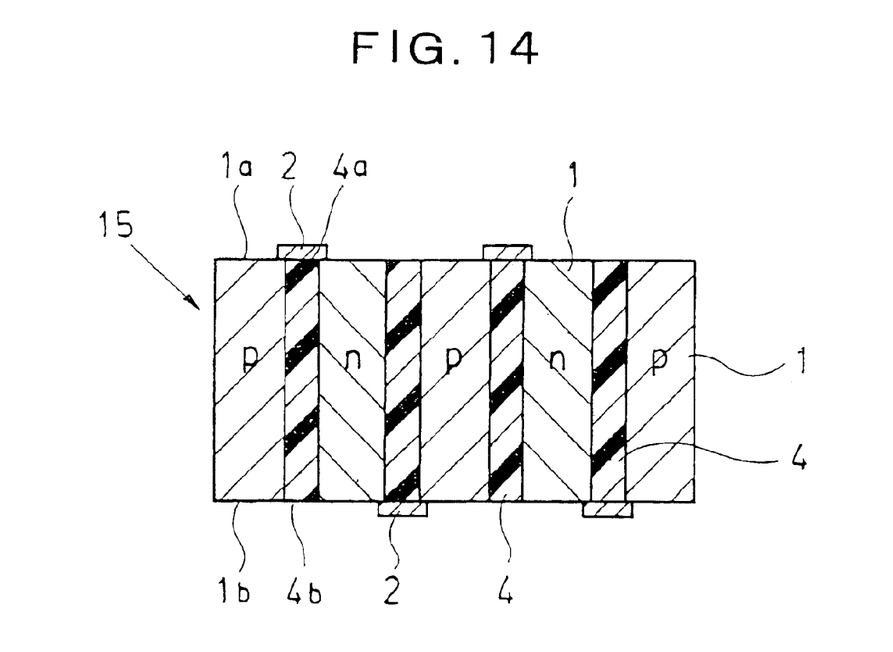
FIGS. 14 to 16 are sectional views sequentially showing respective steps of applying electroless plating to the thermoelectric device block according to a fourth embodiment of the invention.

In contrast with the first to third embodiments, with this embodiment, use is made of a thermoelectric device block 15 wherein the outer sidewall face of thermoelectric semiconductors 1 among respective thermoelectric semiconductors 1, positioned at opposite ends in the direction of arrangement thereof, is not coated with an insulation layer 4 so as to be exposed as shown FIG. 14, however, for other parts such as metallic films, conductive films, an electroless plating bath, and so froth, use is made of the same constituent materials as those used for the corresponding parts in the first embodiment.

Figure 18:
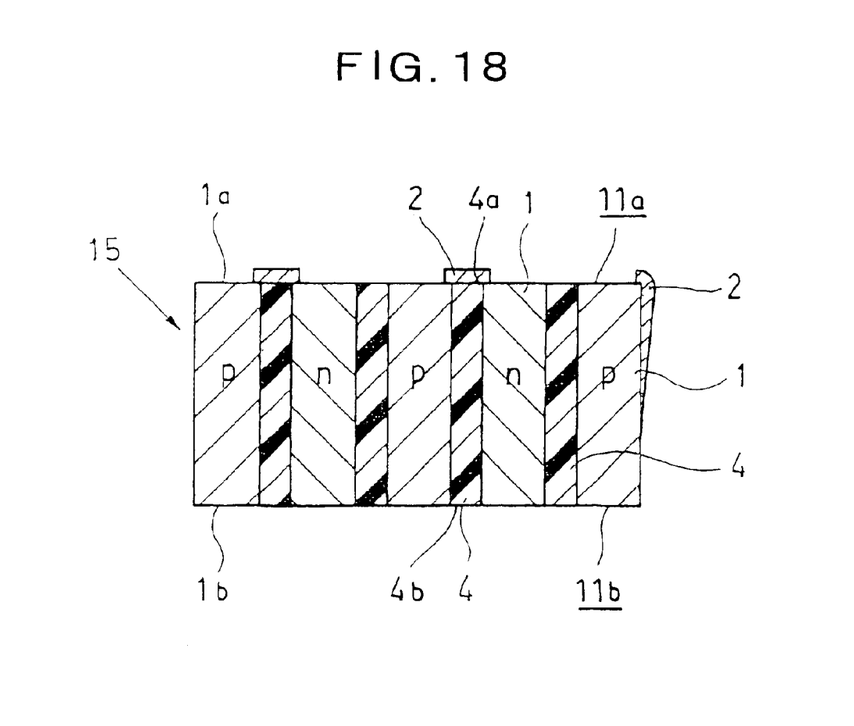
FIG. 18 is a sectional view showing state wherein the metallic film is formed on the another thermoelectric device block in applying electroless plating to the thermoelectric device block according to the fourth embodiment of the invention.

With this embodiment, a metallic film 2 is first formed on an end face 1a or 1b of the respective thermoelectric semiconductors 1 in the same way as in any of the first to third embodiments. In the case of forming the metallic films 2 in the same way as in the third embodiment, each of the metallic films 2 on which an electroless plating film can be deposited is formed on an end face 4a and the other end face 4b of the respective insulation layers 4 of the thermoelectric device block 15 alternately as to span a part of the end faces 1a or the end faces 1b of the adjacent thermoelectric semiconductors 1 with the respective insulation layers 4 interposed therebetween, as shown in FIG. 14. In the case of forming the metallic film 2 in the same way as in the first embodiment, the metallic film 2 are formed as shown in FIG. 4. In the case of forming the metallic films 2 in the same way as in the second embodiment, the metallic films 2 are formed as shown in FIG. 18.

Figure 15:
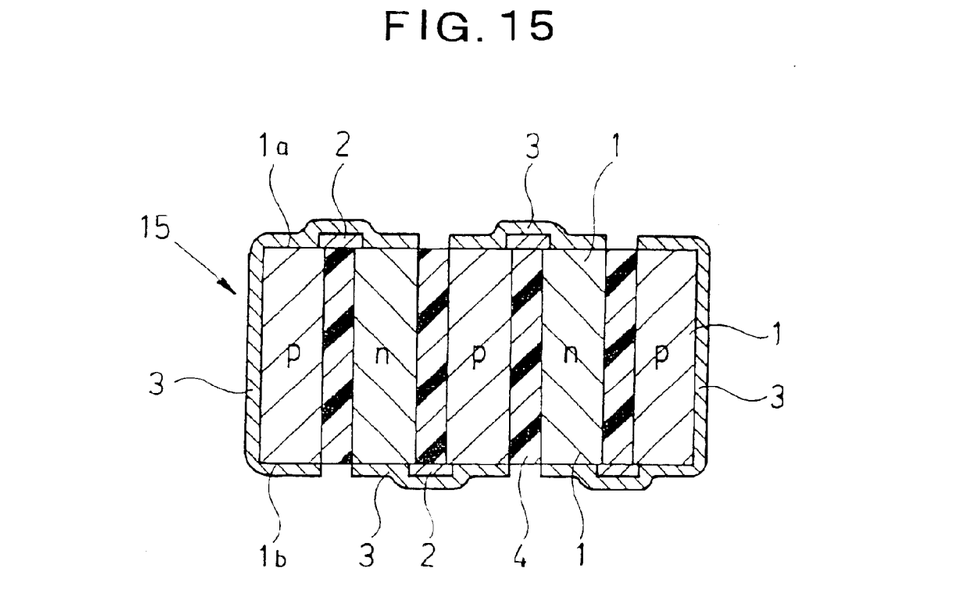

Subsequently, this thermoelectric device block 15 provided with the metallic films 2 is dipped in an electroless plating bath, whereupon deposition reaction of an electroless plating film occurs to the surface of the respective metallic films 2, and simultaneously, deposition reaction of an electroless plating film occurs to the end face 1a and 1b of the thermoelectric semiconductors 1 with the metallic film 2 formed on (in contact with) part thereof, and also to the outer sidewall face as exposed of the respective thermoelectric semiconductors 1 positioned on the outermost sides the thermoelectric device block 15 (at opposite ends in the direction along which the respective thermoelectric semiconductors 1 are arranged). Thus, a conductive film 3 can be formed on the respective metallic films 2, the end face 1a and 1b of the respective thermoelectric semiconductors 1, on opposite sides thereof, and the outer sidewall face as exposed of the respective thermoelectric semiconductors 1 positioned at the opposite ends except for an end face of respective insulation layers 4 without the metallic film 2 formed thereon, thereby enabling the respective thermoelectric semiconductors 1 to be connected in series.

Figure 16:
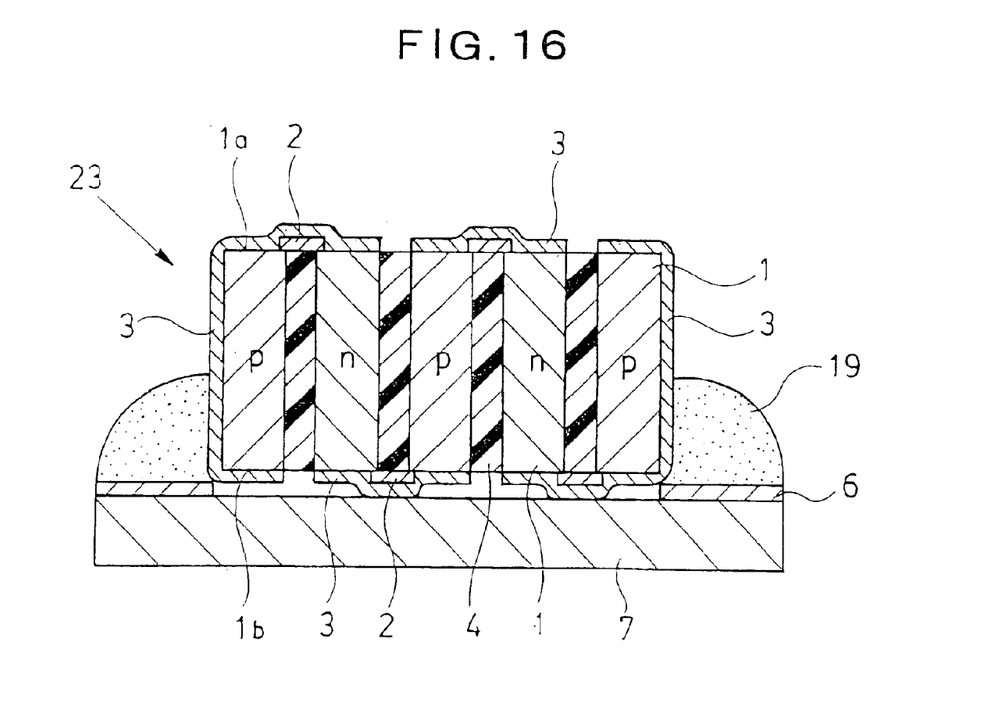

Thereafter, after forming connection layers 19 made of a connecting material such as a conductive adhesive, solder or so forth, the thermoelectric device block 15 with the conductive films 3 formed thereon is mounted on a substrate 7 with a wiring electrode 6 formed thereon as shown in FIG. 16. The respective conductive films 3 of the thermoelectric device block 15 are thereby electrically connected with the wiring electrode 6, thus obtaining a thermoelectric device 23. In this case, with the thermoelectric device block 15 (FIG. 15), since the conductive film 3 is also formed on the outer sidewall face as exposed of the respective thermoelectric semiconductors 1 positioned at the opposite ends in the direction of arrangement thereof, a contact area of the connection layers 19 can be enlarged. As a result, connection of the wiring electrode 6 with the respective conductive films 3 can be implemented with ease, further enabling a connection condition to be ensured.

With any of the first to fourth embodiments described hereinbefore, the surface of the thermoelectric device block, an object to be plated, on which the metallic films 2 or the conductive films 3 are formed, is preferably kept in a rough condition by various methods such as etching, sandblasting, grinding or so forth. Such a practice is more effective in improvement in reliability of the thermoelectric device because it will improve an adhesive property of the conductive films, thereby forming more reliable conductive films.

Further, with any of the first to fourth embodiments described hereinbefore, it is preferable to take a cleaning process step of alkali degreasing, ultrasonic cleaning, running water cleaning or so forth between respective process steps. Such a practice is effective in further improvement in reliability of the thermoelectric device because it can further enhance adhesion between the respective conductive films 3 and the respective thermoelectric semiconductors 1.

INDUSTRIAL APPLICABILITY

With an electroless plating method according the invention, it becomes possible to form a conductive film formed of a metal having a high conductivity by applying electroless plating directly even to a constituent material on which it has been considered that the conductive film by electroless plating can not be deposited directly.

Even with a thermoelectric device block wherein insulation layers and thermoelectric semiconductors are alternately disposed at a minuscule interval in a range of several to several tens of $\mu$m, it becomes possible to selectively form the conductive film uniform in thickness only on both end faces of the respective thermoelectric semiconductors by applying the invention to a method of fabricating a thermoelectric device. Accordingly, the conductive films having an object of providing the thermoelectric device with the connection layer for the respective thermoelectric semiconductors, and having an effect of preventing diffusion of tin, copper and so forth into the respective thermoelectric semiconductors can be easily formed to a uniform thickness on both the end faces of the respective thermoelectric semiconductors, so that productivity and reliability of the thermoelectric device can be improved.

What is claimed is:

1. An electroless plating method comprising the steps of:

forming metallic film made of a metal on which an electroless plating film can be deposited on part of the surface of an object to be plated, or causing the metal to be in contact with part of the surface of the object to be plated, made of a constituent material to which an electroless plating can not be applied; and dipping the object to be plated having said metallic film formed thereon or having said metal in contact therewith in an electroless plating bath, and forming an electroless plating film on the surface of the object to be plated, without the metallic film formed thereon and the metal in contact therewith.

2. An electroless plating method comprising the steps of:

forming a metallic film made of a metal on which an electroless plating film can be deposited on part of the surface of an object to be plated, or causing the metal to be in contact with part of the surface of the object to be plated, made of a constituent material to which an electroless plating can not be applied;

dipping the object to be plated having said metallic film formed thereon or having said metal in contact therewith in an electroless plating bath, and forming an electroless plating film on the entire surface of the object to be plated, containing said metallic film or the metal;

removing said metallic film or the metal, and portions of the electroless plating film, covering up the metallic film or the metal, from said object to be plated; and dipping again the object to be plated subjected to the steps described above in the electroless plating bath.

3. An electroless plating method comprising the steps of:

forming a metallic film made of a metal on which an electroless plating film can be deposited on part of the surface of an object to be plated, or causing the metal to be in contact with part of the surface of the object to be plated, made of a constituent material to which an electroless plating can not be applied; and dipping the object to be plated having the metallic film formed thereon or having the metal in contact therewith in an electroless plating bath, forming an electroless plating film on the surface of the object to be plated, without the metallic film formed thereon and the metal in contact therewith, wherein said object to be plated is made of plural kinds of constituent materials.

4. The electroless plating method of claim 1, wherein said object to be plated is a thermoelectric semiconductor.

5. An electroless plating method according to claim 2, wherein said electroless plating film is formed so as to have a dual-layer structure comprised of not less than two metallic films.

6. An electroless plating method comprising the steps of:

forming a metallic film made of a metal on which an electroless plating film can be deposited on one of end faces of a thermoelectric device block formed integrally with a plurality of thermoelectric semiconductors, disposed with an insulation layer interposed therebetween, respectively;

dipping said thermoelectric device block having the metallic film formed thereon in an electroless plating bath, and forming an electroless plating film on said metallic film and the other end face of the respective thermoelectric semiconductors, on the side thereof, opposite from the end face on which the metallic film is formed;

removing said metallic film and a portion of the electroless plating film covering up the metallic film; and dipping again the thermoelectric device block subjected to the steps described above in the electroless plating bath, and forming an electroless plating film on the end face of the respective thermoelectric semiconductors from which the metallic film is removed.

7. An electroless plating method comprising the steps of:

causing a metal on which an electroless plating film can be deposited to be in contact with a part of at least one of end faces of respective thermoelectric semiconductors of a thermoelectric device block formed integrally with a plurality of thermoelectric semiconductors, disposed with an insulation layer interposed therebetween, respectively;

dipping the thermoelectric device block having said metal in contact therewith in an electroless plating bath, and forming an electroless plating film on the entire surface of the respective thermoelectric semiconductors, except the part thereof, in contact with said metal;

separating the metal in contact with the respective thermoelectric semiconductors therefrom; and dipping again the thermoelectric device block subjected to the steps described above in the electroless plating bath, and forming an electroless plating film on the part of the end faces of the respective thermoelectric semiconductors, in contact with said metal.

8. An electroless plating method comprising the steps of:

forming a metallic film made of a metal on which an electroless plating film can be deposited on an end face of respective insulation layers disposed on the side of one of end faces of a thermoelectric device block formed integrally with a plurality of thermoelectric semiconductors, disposed with the respective insulation layers interposed therebetween, such that the metallic film spans said respective insulation layers and a portion of respective end faces of both the thermoelectric semiconductors adjacent to each other across the respective insulation layers alternately disposed; and dipping the thermoelectric device block having said metallic film formed thereon in an electroless plating bath, and forming an electroless plating film on said metallic film and both end faces of the respective thermoelectric semiconductors with the metallic film formed on the portion of the end face thereof.

9. An electroless plating method comprising the steps of:

forming a metallic film made of a metal on which an electroless plating film can be deposited on either an end face or the other end face of respective insulation layers, alternately, on the sides of both end faces of a thermoelectric device block formed integrally with a plurality of thermoelectric semiconductors, disposed with the respective insulation layers interposed therebetween, such that the metallic film spans the respective insulation layers and a portion of respective end faces of both the thermoelectric semiconductors adjacent to each other across the respective insulation layers; and dipping the thermoelectric device block having said metallic film formed thereon in an electroless plating bath, and forming an electroless plating film on said metallic film and both end faces of the respective thermoelectric semiconductors with the metallic film formed on the portion of the end face and the other end face thereof.

10. An electroless plating method according to claim 6, wherein use is made of said thermoelectric device block provided with an exposed outer sidewall face of respective thermoelectric semiconductors positioned at opposite ends in the direction along which the respective thermoelectric semiconductors are arranged, and an electroless plating film is also formed on the exposed outer sidewall faces of respective thermoelectric semiconductors positioned at opposite ends as well in said step of forming the electroless plating film.

11. An electroless plating method according to claim 6, further comprising the step of rendering the end face of the thermoelectric device block into a rough surface prior to the step of forming the electroless plating film on said thermoelectric device block.

12. An electroless plating method according to claim 6, further comprising the step of cleaning said thermoelectric device block before or after the step of forming the electroless plating film on said thermoelectric device block.

13. An electroless plating method comprising the steps of:

forming a metallic film made of a metal on which an electroless plating film can be deposited on part of the surface of an object to be plated, or causing the metal to be in contact with part of the surface of the object to be plated, made of a constituent material to which an electroless plating can not be applied;

dipping the object to be plated having the metallic film formed thereon or having the metal in contact therewith in an electroless plating bath, and forming an electroless plating film on the entire surface of the object to be plated, containing the metallic film or the metal, including the surface of the object to be plated without the metallic film formed thereon and the metal in contact therewith;

removing the metallic film or the metal, and portions of the electroless plating film, covering up the metallic film or the metal, from the object to be plated; and dipping again the object to be plated subjected to the steps described above in the electroless plating bath, wherein the object to be plated is made of plural kinds of constituent materials.

14. An electroless plating method comprising the steps of:

forming a metallic film made of a metal on which an electroless plating film can be deposited on part of the surface of an object to be plated, or causing the metal to be in contact with part of the surface of the object to be plated, made of a constituent material to which an electroless plating can not be applied;

dipping the object to be plated having the metallic film formed thereon or having the metal in contact therewith in an electroless plating bath, and forming an electroless plating film on the entire surface of the object to be plated, containing the metallic film or the metal;

removing the metallic film or the metal, and portions of the electroless plating film, covering up the metallic film or the metal, from the object to be plated; and dipping again the object to be plated subjected to the steps described above in the electroless plating bath, wherein the object to be plated is a thermoelectric semiconductor.

15. An electroless plating method comprising the steps of:

preparing an object to be plated, comprised of metal or semiconductors, to which an electroless plating can not be applied, and insulators;

forming a metallic film made of a metal on which an electroless plating film can be deposited on part of the surface of the object to be plated, or causing the metal to be in contact with part of the surface of the object to be plated;

dipping the object to be plated having the metallic film formed thereon or having the metal in contact therewith in an electroless plating bath; and forming an electroless plating film on the entire surface of the object to be plated, except for the insulators, including the surface of the object to be plated without the metallic film formed thereon and the metal in contact therewith.

16. An electroless plating method according to claim 1, wherein use is made of a metal or a semiconductor, to which an electroless plating can not be applied, as the constituent material to which an electroless plating can not be applied.

17. An electroless plating method according to claim 2, wherein use is made of a metal or a semiconductor, to which an electroless plating can not be applied, as the constituent material to which an electroless plating can not be applied.

18. An electroless plating method according to claim 3, wherein use is made of a metal or a semiconductor, to which an electroless plating can not be applied, as the constituent material to which an electroless plating can not be applied.

19. An electroless plating method according to claim 13, wherein use is made of a metal or a semiconductor, to which an electroless plating can not be applied, as the constituent material to which an electroless plating can not be applied.

20. An electroless plating method according to any one of claims 1 to 4, claims 6 to 9, and claims 13 to 15, wherein use is made of palladium, platinum or nickel as the metal on which the electroless plating film can be deposited.

21. An electroless plating method according to claim 15, wherein use is made of an insulating resin for the insulators.

22. An electroless plating method according to any one of claims 6 to 9, wherein use is made of an insulating resin for the insulation layers.

* * * * *